(12) United States Patent
Clara et al.

(10) Patent No.: US 12,143,073 B2
(45) Date of Patent: Nov. 12, 2024

(54) SIGNAL ENVELOPE DETECTOR, OVERLOAD DETECTOR, RECEIVER, BASE STATION AND MOBILE DEVICE

(71) Applicant: Intel Corporation, Santa Clara, CA (US)

(72) Inventors: Martin Clara, Santa Clara, CA (US); Giacomo Cascio, Villach (AT)

(73) Assignee: Intel Corporation, Santa Clara, CA (US)

( * ) Notice: Subject to any disclaimer, the term of this patent is extended or adjusted under 35 U.S.C. 154(b) by 809 days.

(21) Appl. No.: 17/131,962

(22) Filed: Dec. 23, 2020

(65) Prior Publication Data

US 2022/0200545 A1 Jun. 23, 2022

(51) Int. Cl.
*H03F 3/19* (2006.01)
*H03F 3/193* (2006.01)
(Continued)

(52) U.S. Cl.
CPC .............. *H03F 3/19* (2013.01); *H03F 3/193* (2013.01); *H03F 3/245* (2013.01); *H03F 3/505* (2013.01);
(Continued)

(58) Field of Classification Search
CPC . H03F 3/19; H03F 3/193; H03F 3/245; H03F 3/505; H03F 2200/102;
(Continued)

(56) References Cited

U.S. PATENT DOCUMENTS

2009/0153248 A1* 6/2009 Sun ...................... H03G 3/3042
330/264
2015/0311895 A1* 10/2015 Ali ........................ H03F 1/3205
327/319

OTHER PUBLICATIONS

Robert G. Meyer: "Low-Power Monolithic RF Peak Detector Analysis" IEEE J. Solid-State Circuits, vol. 30, No. 1, Jan. 1995, pp. 65-57.

(Continued)

*Primary Examiner* — Andrea Lindgren Baltzell
*Assistant Examiner* — Khiem D Nguyen
(74) *Attorney, Agent, or Firm* — SPL Patent Attorneys PartG mbB; Yong Beom Hwang

(57) ABSTRACT

A signal envelope detector is provided. The signal envelope detector includes an input node configured to receive an input signal. Further, the signal envelope detector includes a capacitive voltage divider coupled to the input node and configured to generate an attenuated input signal by voltage division of the input signal. The signal envelope detector additionally includes a source follower transistor coupled between a first node configured to receive a first voltage supply signal and a second node configured to receive a second voltage supply signal. A gate terminal of the source follower transistor is coupled to the capacitive voltage divider and configured to receive the attenuated input signal. The signal envelope detector includes a rectifier circuit configured to receive and rectify an output signal of the source follower transistor. In addition, the signal envelope detector includes a low-pass filter coupled to the rectifier circuit and configured to generate an envelope signal indicative of a rectified envelope of the input signal by low-pass filtering of an output signal of the rectifier circuit.

25 Claims, 9 Drawing Sheets

(51) Int. Cl.
 *H03F 3/24* (2006.01)
 *H03F 3/50* (2006.01)
(52) U.S. Cl.
 CPC .. *H03F 2200/102* (2013.01); *H03F 2200/451* (2013.01); *H03F 2203/5003* (2013.01)
(58) Field of Classification Search
 CPC ....... H03F 2200/451; H03F 2203/5003; H03F 3/45179; G01R 19/04
 USPC ........................................................ 330/295
 See application file for complete search history.

(56) References Cited

OTHER PUBLICATIONS

Karthik Jayaraman et al.: "Design and Analysis of 1-60GHZ, RF CMOS Peak Detectors for LNA Calibration", IEEE J. Solid-State Circuits, 2009, pp. 311-314.

\* cited by examiner

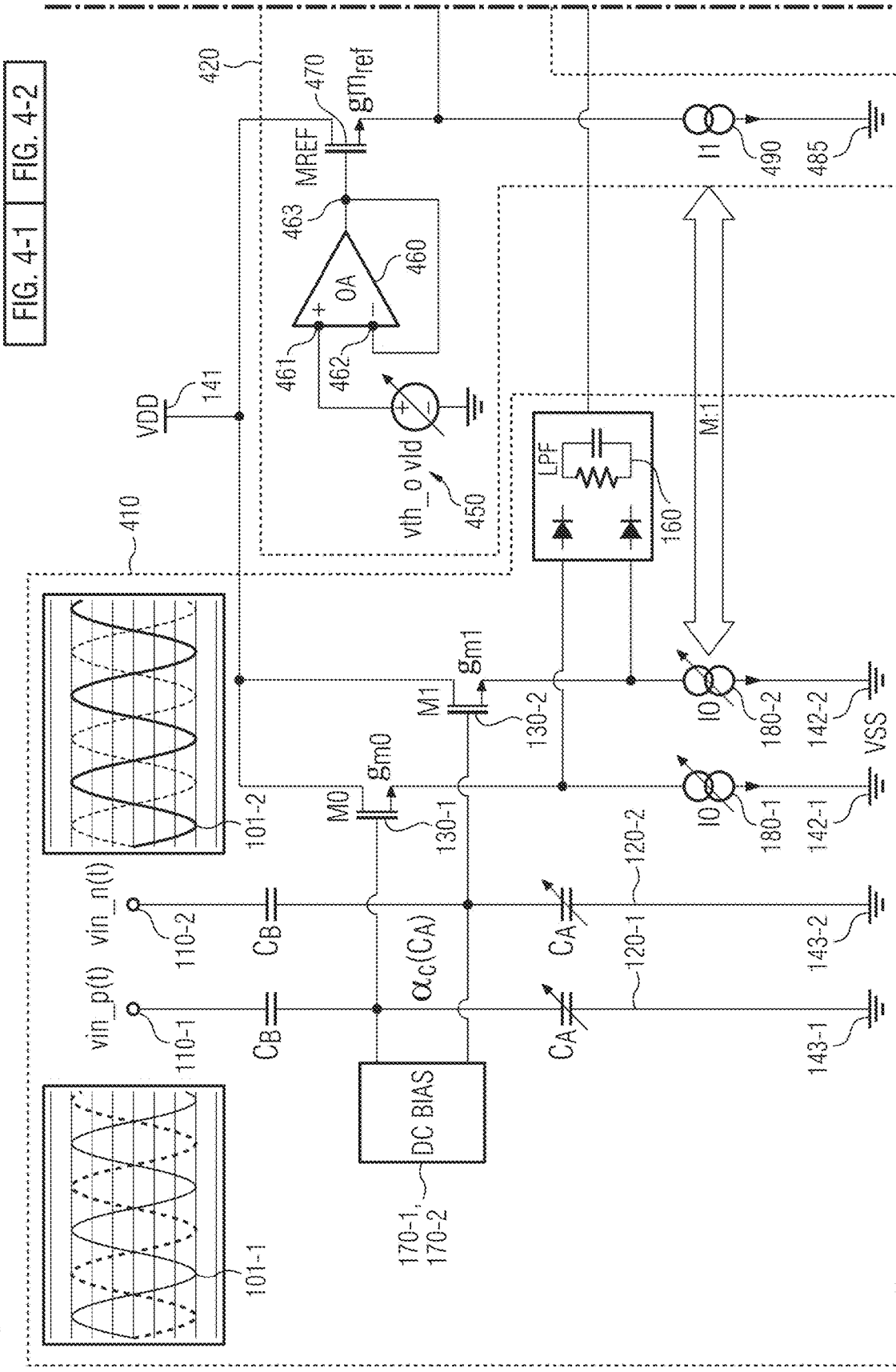

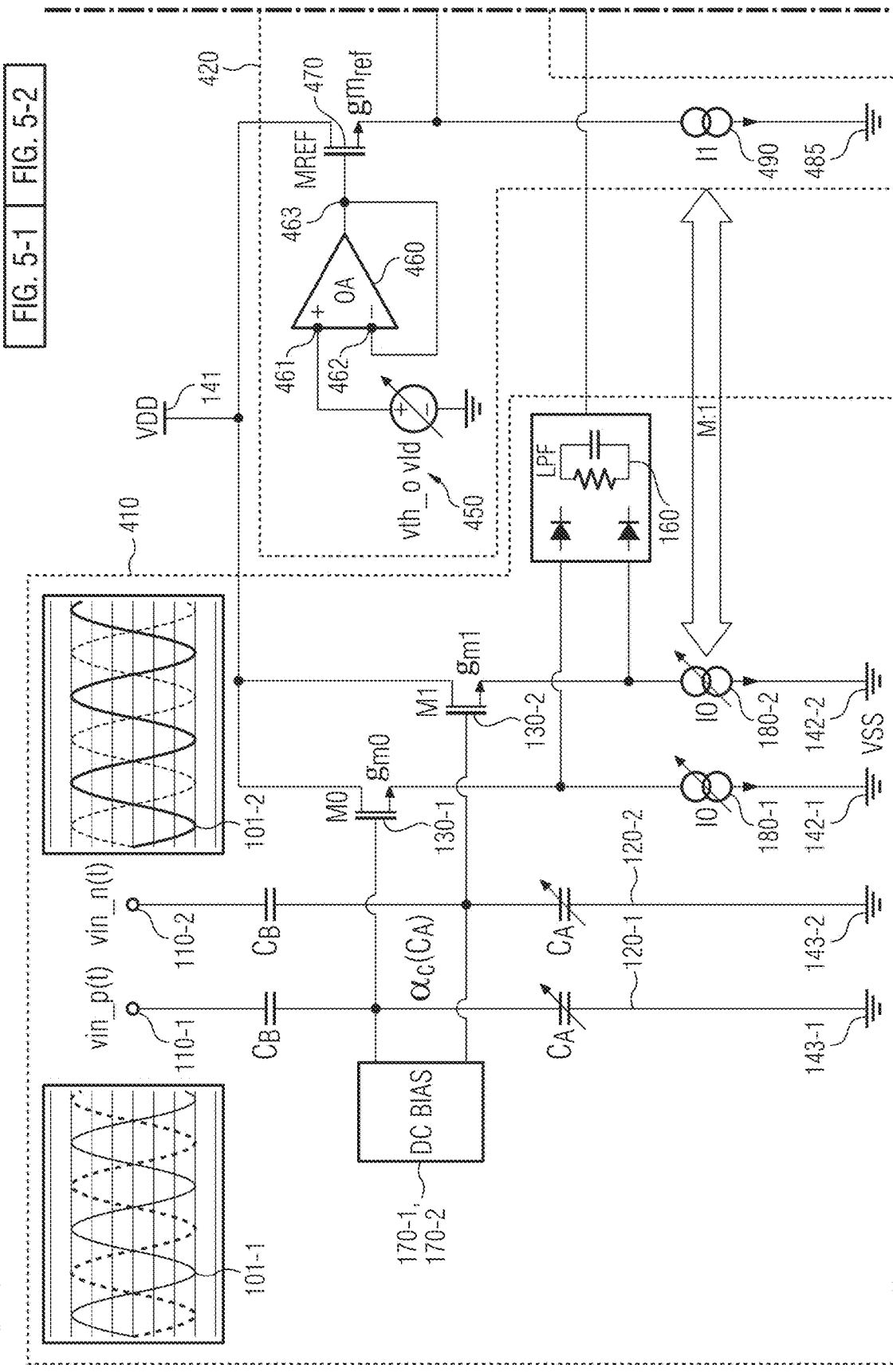

SIGNAL ENVELOPE DETECTOR, OVERLOAD DETECTOR, RECEIVER, BASE STATION AND MOBILE DEVICE

FIELD

The present disclosure relates to monitoring of signals. In particular, examples relate to a signal envelope detector, an overload detector comprising the signal envelope detector, a receiver comprising the overload detector, a base station comprising the receiver and a mobile device comprising the receiver.

BACKGROUND

Many electronic circuits such as on-chip buffer(s) of high-speed Analog-Digital Converters (ADCs) may be exposed to input overload situations (e.g. in presence of blockers). The circuits may be extensively exposed—for an undefined time span—to overstress beyond the Safe-Operating-Area (SOA) which can cause drift over life-time or ultimately irreversible damage of the product in the field.

Hence, there may be a desire to monitor signals and detect input overload.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
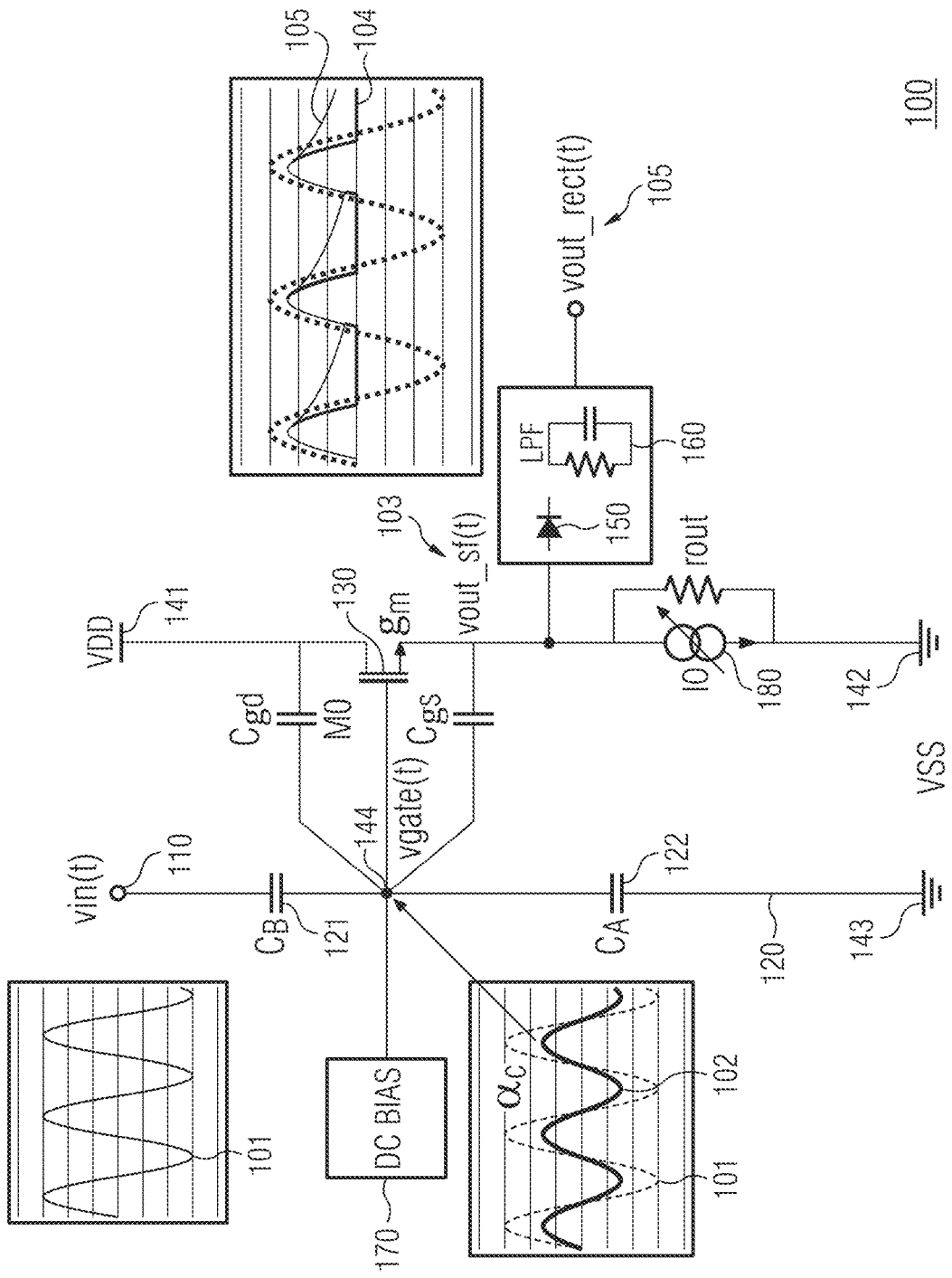
FIG. 1 illustrates a first example of a signal envelope detector.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an example of a signal envelope detector 100. The signal envelope detector 100 comprises an input node 110 configured to receive an input signal 101. For example, the input signal 101 may be a Radio Frequency (RF) signal.

Additionally, the signal envelope detector 100 comprises a source follower transistor 130, i.e. a transistor in source follower configuration (also known as common drain configuration). In the example of FIG. 1, the source follower transistor 130 is an n-type (n-channel) transistor. However, it is to be noted that the present disclosure is not limited thereto. In alternative examples, the source follower transistor 130 may be a p-type (p-channel) transistor. The source follower transistor 130 is coupled between a node 141 configured to receive a first voltage supply signal (e.g. a positive supply voltage $V_{DD}$) and a node 142 configured to receive a second voltage supply signal (e.g. a negative supply voltage $V_{SS}$ or ground). In other words, the source follower transistor 130 is coupled between two electrical potentials.

The signal envelope detector 100 further comprises a capacitive voltage divider 120 coupled to the input node 110 and configured to generate an attenuated input signal 102 by voltage division of the input signal 101. The capacitive voltage divider 120 comprises a first capacitive element 121 and a second capacitive element 122. The first capacitive element 121 is coupled between the input node 110 and the second capacitive element 122. The second capacitive element is coupled between the first capacitive element 121 and a node 143. The node 143 is configured to receive the second voltage supply signal.

A gate terminal of the source follower transistor 130 is coupled to the capacitive voltage divider 120 and configured to receive the attenuated input signal 102. In particular, the gate terminal of the source follower transistor 130 is coupled to a node 144 of the capacitive voltage divider 120. The node 144 is coupled (arranged) between the first capacitive element 121 and the second capacitive element 122.

The attenuation level $\alpha_C$ of the capacitive voltage divider 120 is determined by the capacitances of the first capacitive element 121 and the second capacitive element 122. For example, the attenuation level $\alpha_C$ of the capacitive voltage divider 120 may be as follows:

$$\alpha_C = \frac{C_B}{C_B + C_A} \quad (1)$$

with $C_B$ denoting the capacitance of the first capacitive element 121 and with $C_A$ denoting the capacitance of the second capacitive element 122.

The capacitive voltage divider 120 is used as input stage for the source follower transistor 130 to extend the input detection range and at the same time prevent the gate terminal of the source follower transistor 130 (e.g. a gate oxide in case of a Metal-Oxide-Semiconductor Field-Effect Transistor, MOSFET) from exposure a potential breakdown risk or degradation (e.g. threshold voltage drift or leakage) due to transient electrical overstress in an overload condition.

A rectifier circuit 150 is coupled to an output terminal (such as the source terminal) of the source follower transistor 130. The rectifier circuit 150 is configured to receive and rectify an output signal 103 of the source follower transistor 130. In the example of FIG. 1, the rectifier circuit 150 is a diode. However, it is to be noted that the present disclosure is not limited thereto. In alternative examples, other circuitry may be used for rectifying the output signal 103 of the source follower transistor 130.

The signal envelope detector 100 further comprises a low-pass filter 160 coupled to the rectifier circuit 150. The low-pass filter 160 is configured to generate an envelope signal 104 indicative of a rectified envelope of the input signal 101 by low-pass filtering an output signal 104 of the rectifier circuit 150. In the example of FIG. 1, the low-pass filter 160 is a passive first order low-pass filter formed by a resistor and a capacitor. However, it is to be noted that the present disclosure is not limited thereto. In alternative examples, a higher order low-pass filter may be used instead. In other examples, the low-pass filter 160 may be an active filter. In further examples, the low-pass filter 160 may be tunable, i.e. a filter characteristic of the low-pass filter 160 may be adjustable. For example, the filtering transfer function may be adapted to the specific input signal 101 (e.g. frequency, dynamic, settling requirement, etc.).

The signal envelope detector 100 may allow a real-time tracking of the input signal 101's envelope. The source follower transistor 130 in open loop configuration together with the rectifier circuit 150 may allow a half-wave rectification of the input signal 101 (e.g. an RF signal). Further, the source follower transistor 130 may allow for high impedance between the envelope signal 104 and the input signal 101 (i.e. the signal path supplying the input signal 101 to the signal envelope detector 100). In addition, the capacitive voltage divider 120 serving as input stage of the signal envelope detector 100 may allow the extend the maximum detectable input power range without exposing the remaining circuitry of the signal envelope detector 100 to excessive Electrical OverStress (EOS). The capacitive voltage divider 120 may be understood as an internal attenuator of the signal envelope detector 100. Therefore, the signal envelope detector 100 may, e.g., be suitable for use in a RF-input stage for tracking the signal envelope of RF input signals.

The signal envelope detector 100 further comprises a bias current source 180 coupled between the source follower transistor 130 and the node 142. The bias current source is configured to supply, based on a control signal, an adjustable bias current to the source terminal of the source follower transistor 130. The bias current source 180 may be understood as a programmable bias current source. For example, the control signal may be a digital control signal such that the bias current source 180 may be digitally controlled. The adjustable bias current allows to define the transconductance $g_m$ of the source follower transistor 130 and, hence, the bandwidth of the source follower transistor 130 and the signal envelope detector 100. The quiescent point of the source follower transistor 130 may be adjusted by means of the adjustable bias current such that the output resistance $R_{out}$ of the source follower transistor 130 is $R_{out} \gg 1/g_m$. Accordingly, the voltage gain $A_v$ of the source follower transistor 130 may be approximated as follows:

$$A_v = \frac{g_m \cdot R_{out}}{g_m \cdot R_{out} + 1} \cong 1 \qquad (2)$$

Therefore, the output signal 103 of the source follower transistor 130 is substantially the signal input to the gate of the source follower transistor 130. The source follower transistor 130 may allow to decouple and isolate the input signal 101 (and hence the signal path supplying the input signal 101 to the signal envelope detector) from the output signal 103 of the source follower transistor 130 since in a first approximation and at sufficiently lower frequency, the following holds true for the input resistance $R_{in}$ seen at the gate terminal of the source follower transistor 130:

$$R_{in} \cong \frac{V_{in}}{I_{in}} \to \infty \qquad (3)$$

with $V_{in}$ denoting the voltage applied to the gate terminal of the source follower transistor 130 and $I_{in}$ denoting the current applied to the gate terminal of the source follower transistor 130. The voltage and the current applied to the gate terminal of the source follower transistor 130 depend on the input signal 101.

The capacitances of the first capacitive element 121 and the second capacitive element 122 may, e.g., be selected based on constraints of the signal path supplying the input signal 101 to the signal envelope detector 100. For example, if the signal envelope detector 100 is used with an RF front-end, the capacitances of the first capacitive element 121 and the second capacitive element 122 may be selected according to RF front-end input constraints such as, e.g., a return loss below a certain specification in a certain frequency range.

For example, the capacitance $C_A$ of the second capacitive element 122 may be equal to or greater than a sum of a gate-source capacitance $C_{gs}$ and a gate-drain capacitance $C_{gd}$ of the source follower transistor 130. Similarly, the capacitance $C_B$ of the first capacitive element 121 may be equal to or greater than the sum of the gate-source capacitance $C_{gs}$ and the gate-drain capacitance $C_{gd}$ of the source follower transistor 130. In some examples, the capacitances $C_B$ and $C_A$ of the first capacitive element 121 and the second capacitive element 122 may be much larger than each of the gate-source capacitance $C_{gs}$ and the gate-drain capacitance $C_{gd}$ of the source follower transistor 130. That is, $C_A$, $C_B \gg C_{gs}$, $C_{gd}$ in some examples. For example, the capacitance $C_A$ of the second capacitive element 122 may be about 5 times the gate-source capacitance $C_{gs}$ of the source follower transistor 130.

In the example of FIG. 1, each of the first capacitive element 121 and the second capacitive element 122 is formed by a single capacitor. However, the present disclosure is not limited thereto. In alternative examples, at least one of the first capacitive element 121 and the second capacitive element 122 may be formed by a plurality of coupled capacitors. The capacitances of the first capacitive element 121 and the second capacitive element 122 may be fixed (i.e. unchangeable) in some examples. According to other examples, at least one of the of the first capacitive element 121 and the second capacitive element 122 may be configured to adjust its capacitance based on one or more respective control signals. For example, the second capacitive element 122 may be configured to adjust its capacitance $C_A$ based on one or more control signals in order to adjust the attenuation level $\alpha_C$ of the capacitive voltage divider 120 in accordance with mathematical expression (1).

The signal envelope detector 100 additionally comprises a bias voltage source 170 coupled to the node 144. The bias voltage source 170 is configured to supply, based on another control signal, an adjustable DC bias voltage to the node 144. For example, the other control signal may be a digital control signal such that the bias voltage source 170 may be digitally controlled. The gate terminal of the source follower transistor 130 is coupled to the node 144 such that the gate voltage and, hence, the quiescent point of the source follower transistor 130 may be adjusted.

Figure 2:
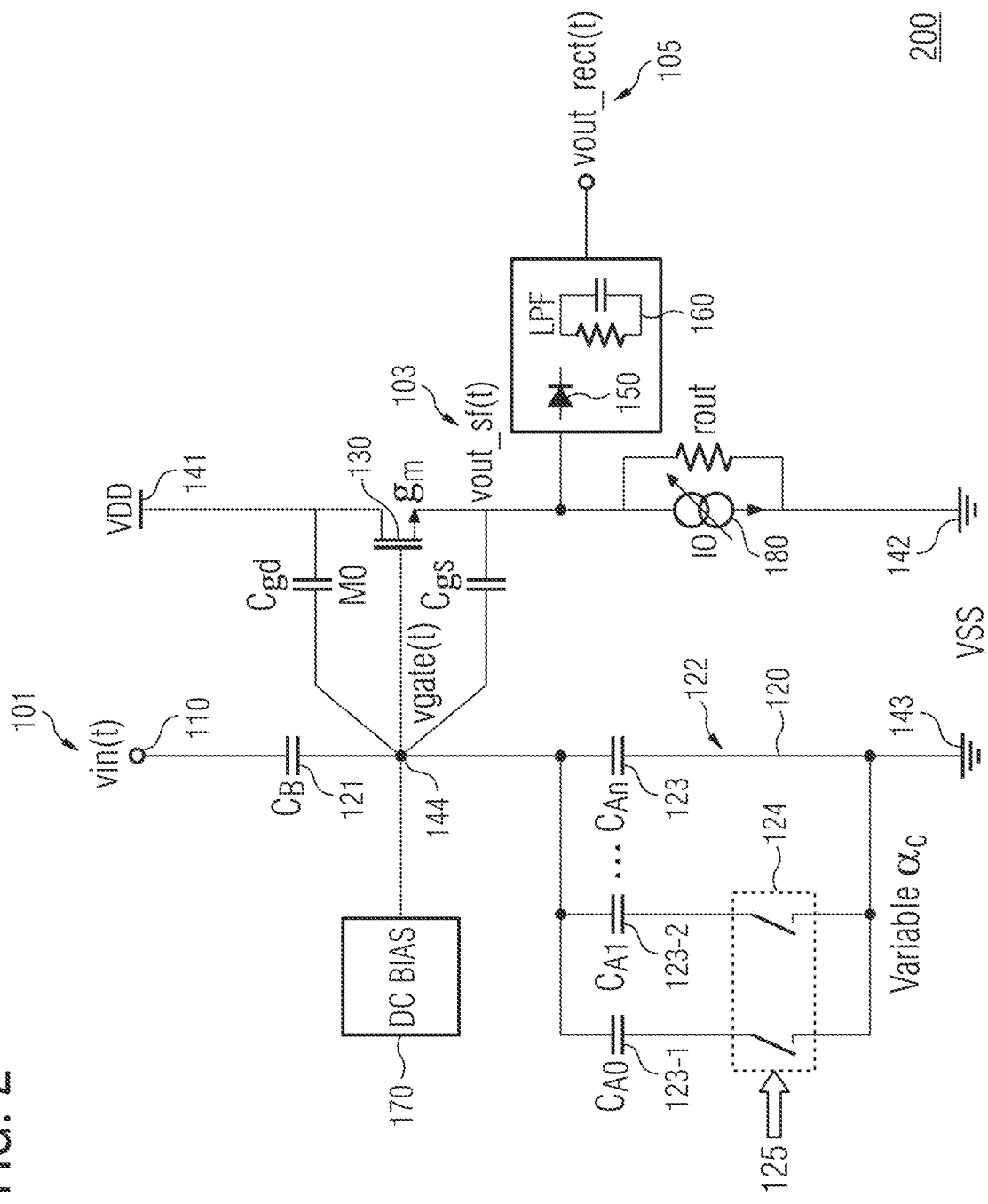
FIG. 2 illustrates a second example of a signal envelope detector.

FIG. 2 illustrates another exemplary signal envelope detector 200 in which the second capacitive element 122 comprises a plurality of capacitors such that the capacitance $C_A$ of the second capacitive element 122 is adjustable. Other than that, the signal envelope detector 200 is identical to the above described signal envelope detector 100.

The second capacitive element 122 of the signal envelope detector 200 comprises a first capacitor 123 coupled between the node 143 and the node 144. Additionally, the second capacitive element 122 comprises a plurality of second capacitors and a switch circuit 124 configured to selectively couple, based on the one or more control signals 125, one or more of the plurality of second capacitor capacitors in parallel to the first capacitor 123. In the example of FIG. 2, two second capacitors 123-1 and 123-2 are illustrated which may be selectively coupled in parallel to the first capacitor 123 by the switch circuit 124. It is to be noted that more than two second capacitors may be used in other examples. The switch circuit 124 comprises a respective switch (e.g. a semiconductor switch such as a MOS switch) for each of the second capacitors 123-1 and 123-2. The respective switch of the switch circuit 124 is coupled in series with the assigned second capacitor. Based on the one or more control signals 125, one or more of the second capacitors 123-1 and 123-2 may be coupled in parallel with the first capacitor 123 so as to adjust the overall capacitance of the second capacitive element 122. For example, the one or more control signals 125 may be digital signals such that the capacitance of the second capacitive element 122 may be digitally controlled.

By adjusting the capacitance of the second capacitive element 122, the attenuation level $\alpha_C$ of the capacitive voltage divider 120 may be adjusted in accordance with mathematical expression (1). Accordingly, it is possible to change the input power detection range of the signal envelope detector 200 (e.g. multi-range monitoring may be enabled). Further, the full-scale (i.e. the maximum detectable input power) of the signal envelope detector 200 may be significantly increased even beyond the breakdown limit of the source follower transistor 130 (which may, e.g., be determined by the breakdown limit of the source follower transistor 130's gate-oxide).

Figure 3:
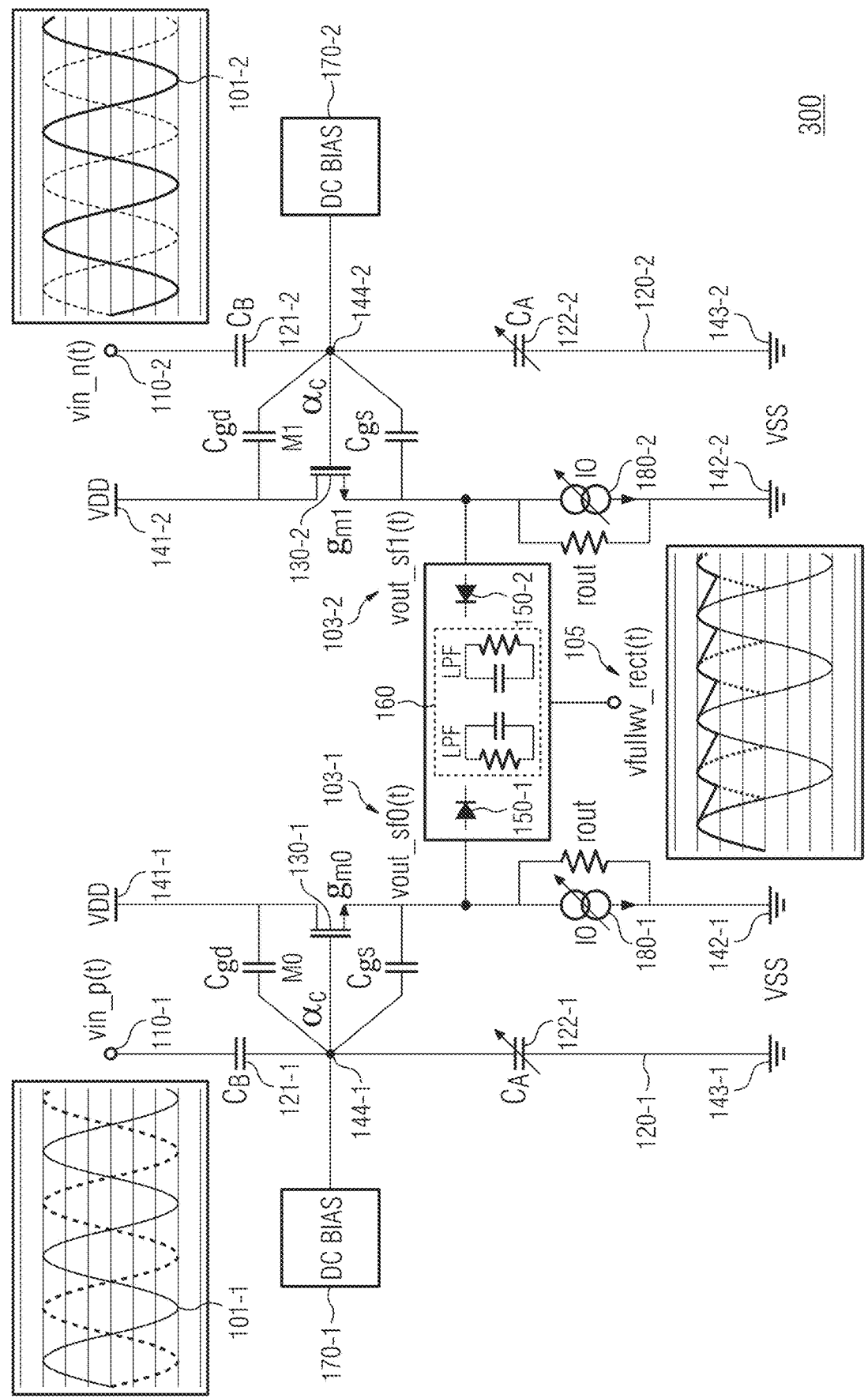
FIG. 3 illustrates a third example of a signal envelope detector.

FIG. 1 and FIG. 2 illustrate single-ended examples of the proposed technology. However, it is to be noted that the present disclosure is not limited thereto. The proposed technology may analogously be used for differential systems. An example of a differential signal envelope detector 300 is illustrated in FIG. 3. Similar to what is described above for the single-ended signal envelope detectors 100 and 200, the signal envelope detector 300 may enable full-wave rectification and tracking of both polarities (positive and negative) of a differential input signal (e.g. an RF signal). Hence, the signal envelope detector 300 may allow to extract the envelop of the differential input signal.

The signal envelope detector 300 comprises an input node 110-1 configured to receive an input signal 101-1 and another input node 110-2 configured to receive another input signal 101-2. The input signal 101-1 and the other signal 101-2 form a differential input signal pair. For example, the input signals 101-1 and 101-2 may be RF signals.

Further, the signal envelope detector 300 comprises a capacitive voltage divider 120-1 coupled to the input node 110-1. The capacitive voltage divider 120-1 is configured to generate an attenuated input signal by voltage division of the input signal 101-1. Analogously, the signal envelope detector 300 comprises another capacitive voltage divider 120-2 coupled to the other input node 110-2. The other capacitive voltage divider 120-2 is configured to generate another attenuated input signal by voltage division of the other input signal 101-2.

Similarly to what is described above, the capacitive voltage divider 120-1 comprises a first capacitive element 121-1 and a second capacitive element 122-1. The first capacitive element 121-1 is coupled between the input node 110-1 and the second capacitive element 122-1. The second capacitive element 122-1 is coupled between the first capacitive element 121-1 and a node 143-1 configured to receive the second voltage supply signal. Analogously, the other capacitive voltage divider 120-2 comprises a third capacitive element 121-2 and a fourth capacitive element 122-2. The third capacitive element 121-2 is coupled between the other input node 110-2 and the fourth capacitive element 122-2. The fourth capacitive element 122-2 is coupled between the third capacitive element 121-2 and a node 143-2 configured to receive the second voltage supply signal. Although the nodes 143-1 and 143-2 are illustrated as separate nodes in FIG. 3, it is to be noted that the nodes 143-1 and 143-2 may concur (be identical) according to alternative examples.

In the example of FIG. 3, a capacitance of the second capacitive element 122-1 is adjustable. In other words, the second capacitive element 122-1 is configured to adjust its capacitance based on one or more control signals. For example, the second capacitive element 122-1 may be implemented like the second capacitive element 122 described above with respect to FIG. 2. Analogously, the fourth capacitive element 122-2 is configured to adjust its capacitance based on one or more other control signals. For example, the fourth capacitive element 122-2 may be implemented like the second capacitive element 122 described above with respect to FIG. 2. However it is to be noted that the present disclosure is not limited thereto. In other examples, the capacitances of the second capacitive element 122-1 and the fourth capacitive element 122-2 may be fixed. In general, the capacitances of the capacitive elements 121-1, 121-2, 122-1 and 122-2 may be selected as described above for the capacitive elements 121 and 122 with respect to FIG. 1 and FIG. 2.

The signal envelope detector 300 additionally comprises a source follower transistor 130-1 coupled between a node 141-1 configured to receive the first voltage supply signal and a node 142-1 configured to receive the second voltage supply signal. Analogously, the signal envelope detector 300 comprises another source follower transistor 130-2 coupled between a node 141-2 configured to receive the first voltage supply signal and a node 142-2 configured to receive the second voltage supply signal. Although the nodes 141-1 and 141-2 as well as the nodes 142-1 and 142-2 are illustrated as separate nodes in FIG. 3, it is to be noted that the nodes 141-1 and 141-2 may concur and that also the nodes 142-1 and 142-2 may concur according to alternative examples.

A gate terminal of the source follower transistor 130-1 is coupled to the capacitive voltage divider 120-1 and configured to receive the attenuated input signal. In particular, the gate terminal of the source follower transistor 130-1 is coupled to a node 144-1 of the capacitive voltage divider 120-1 that is coupled (arranged) between the first capacitive element 121-1 and the second capacitive element 122-1. Analogously, a gate terminal of the other source follower transistor 130-2 is coupled to the other capacitive voltage divider 120-2 and configured to receive the other attenuated input signal. The gate terminal of the other source follower transistor 130-2 is coupled to a node 144-2 of the other capacitive voltage divider 120-2 that is coupled (arranged) between the third capacitive element 121-2 and the fourth capacitive element 122-2.

The signal envelope detector 300 comprises a bias voltage source 170-1 coupled to the node 144-1. Similarly to what is described above, the bias voltage source 170-1 is configured to supply, based on a further control signal, an adjustable DC bias voltage to the node 144-1. The gate terminal of the source follower transistor 130-1 is coupled to the node 144-1 such that the gate voltage and, hence, the quiescent point of the source follower transistor 130-1 may be adjusted. Analogously, the signal envelope detector 300 comprises another bias voltage source 170-2 coupled to the node 144-2. The other bias voltage source 170-2 is configured to supply, based on a still further control signal, another adjustable DC bias voltage to the node 144-2. The gate terminal of the other source follower transistor 130-2 is coupled to the node 144-2 such that the gate voltage and, hence, the quiescent point of the other source follower transistor 130-2 may be adjusted. Although two separate bias voltage source 170-1 and 170-2 are illustrated in FIG. 3, it is to be noted that the present disclosure is not limited thereto. In alternative examples, the bias voltage source 170-1 may concur with the other bias voltage source 170-2, i.e. a single bias voltage source may be used for biasing the source follower transistors 130-1 and 130-2.

The signal envelope detector 300 further comprises a bias current source 180-1 coupled between the source follower transistor 130-1 and the node 142-1. Similarly to what is described above, the bias current source 180-1 is configured to supply, based on a control signal, an adjustable bias current to the source terminal of the source follower transistor 130-1 in order to adjust the transconductance $g_{m0}$ and, hence, the quiescent point of the source follower transistor 130-1. Analogously, the signal envelope detector 300 comprises another bias current source 180-2 coupled between the other source follower transistor 130-2 and the node 142-2. The bias current source 180-2 is configured to supply, based on another control signal, another adjustable bias current to the source terminal of the source follower transistor 130-2 in order to adjust the transconductance $g_{m1}$ and, hence, the quiescent point of the other source follower transistor 130-2.

A rectifier circuit 150-1 is coupled to an output terminal (such as the source terminal) of the source follower transistor 130-1. The rectifier circuit 150-1 is configured to receive and rectify an output signal 103-1 of the source follower transistor 130-1. Analogously, another rectifier circuit 150-2 is coupled to an output terminal (such as the source terminal) of the other source follower transistor 130-2. The other rectifier circuit 150-2 is configured to receive and rectify an output signal 103-2 of the other source follower transistor 130-2. The rectifier circuits 150-1 and 150-2 may be implemented as described above for the rectifier circuit 150 with respect to FIG. 1.

The signal envelope detector 100 further comprises a low-pass filter 160 coupled to the rectifier circuit 150-1 and the other rectifier circuit 150-2. The low-pass filter 160 is configured to generate an envelope signal 105 by low-pass filtering an output signal of the rectifier circuit 150-1 and an output signal of the other rectifier 150-2. Similar to what is described above, the envelope signal 105 is indicative of a rectified envelope of the differential input signals 101-1 and 101-2. The low-pass filter 160 may be implemented as described above with respect to FIG. 1.

The circuit arrangement shown in FIG. 3 is capable of extracting the envelop of the differential input signal. In particular, the signal envelope detector 300 may allow a non-inverting full-wave rectification.

Figures 2, 4:
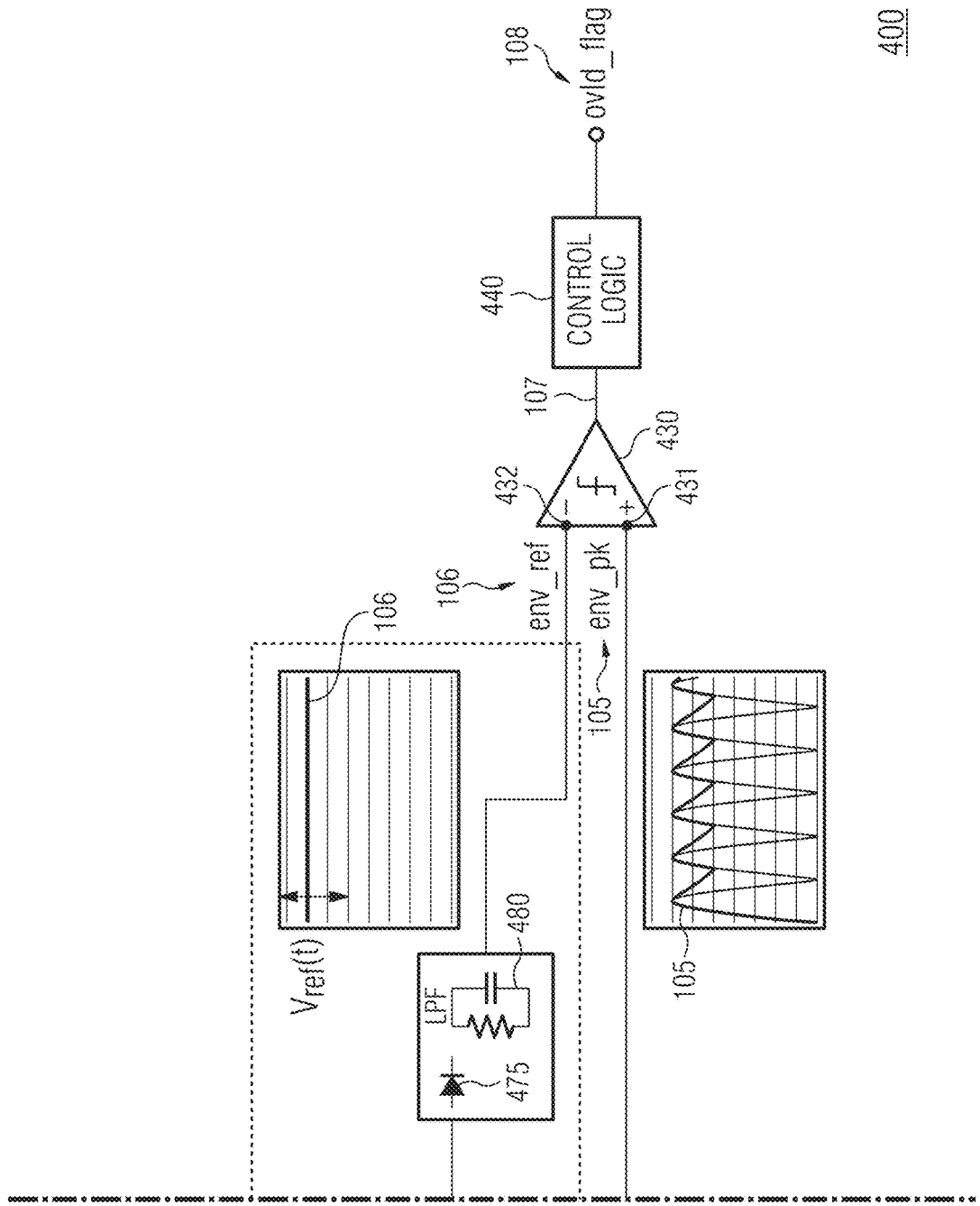
FIG. 4 illustrates a first example of an overload detector.

Signal envelope detectors according to the present disclosure may be used in circuitry for overload detection. An example of an overload detector 400 using a signal envelope detector as proposed is illustrated in FIG. 4.

The overload detector 400 comprises a signal envelope detector 410 as proposed. In particular, the signal envelope detector 410 is the signal envelope detector 300 described above with reference to FIG. 3. In the example of FIG. 4, the source follower transistors 130-1 and 130-2 are coupled to the same node 141 for receiving the first voltage supply signal. As described above, this is an alternative to providing separate nodes as illustrated in FIG. 3. Although the signal envelope detector 410 is the signal envelope detector 300 in the example of FIG. 4, it is to be noted that the present disclosure is not limited thereto. In general, any signal envelope detectors according to the proposed technology may be used for the overload detector 400. For example, one of the signal envelope detectors 100 and 200 may be used as the signal envelope detector 410 instead for performing overload detection on a single-ended input signal.

As described above for the signal envelope detector 300, the signal envelope detector 410 generates an envelope signal 105 indicative of the rectified envelope of the differential input signals 101-1 and 101-2.

The overload detector 400 additionally comprises a reference generation circuit 420 configured to generate an adjustable reference signal 106 based on one or more control signals. In particular, the reference generation circuit 420 is configured to adjust a signal level (e.g. a voltage level) of the adjustable reference signal 106 based on the one or more control signals. An exemplary configuration of the reference generation circuit 420 is illustrated in FIG. 4. However, it is to be noted that the present disclosure is not limited thereto. The reference generation circuit 420 may comprises elements other than those illustrated in FIG. 4 or additional elements.

The reference generation circuit 420 comprises a source follower transistor 470 coupled between the node 141 configured to receive the first voltage supply signal and a node 490 configured to receive the second voltage supply signal. It is to be noted that the source follower transistor 470 may in alternative examples be coupled to a separate node receiving the first voltage supply signal instead of being coupled to the node 141. Although the node 485 is illustrated as a separate node in FIG. 4, the node 485 may concur with one or more of the nodes 142-1, 142-2, 143-1 and 143-2 in other examples.

Additionally, the reference generation circuit 420 comprises a voltage source 450 configured to output an adjustable voltage signal based on the one or more control signals.

For example, the one or more control signals may be digital signals such that the voltage source 450 may be digitally controlled.

The reference generation circuit 420 further comprises an operational amplifier 460. The operational amplifier 460 is configured to receive the adjustable voltage signal from the voltage source 450 at a first input node 461. The operational amplifier 460 is configured to output its output signal at an output node 463. The output node 463 is coupled to a second input node 462 of the operational amplifier 460 such that the operational amplifier 460 is configured to receive the output signal of the operational amplifier 460 at the second input node. In other words, the operational amplifier 460 is a feedback amplifier working as voltage buffer. A gate terminal of the source follower transistor 470 is further coupled to the output node 463 of the operational amplifier 460 such that the operational amplifier 460 is further configured to supply its output signal to the gate terminal of the further source follower transistor 470.

A further bias current source 490 is coupled between the source follower transistor 470 and the node 485. The further bias current source 490 is configured to supply a further bias current to a source terminal of the source follower transistor 470. The bias current provided by the further bias current source 490 may be fixed as in the example of FIG. 4, or be adjusted by the further bias current source 490 based on one or more control signals. Accordingly, the transconductance $g_{mref}$ and, hence, the quiescent point of the source follower transistor 470 may be set (adjusted).

A further rectifier circuit 475 is coupled to an output terminal (such as the source terminal) of the source follower transistor 470. The further rectifier circuit 475 is configured to receive and rectify an output signal of the further source follower transistor 470. The further rectifier circuit 475 may be implemented as described above for the rectifier circuit 150 with respect to FIG. 1.

The reference generation circuit 420 further comprises a low-pass filter 480 coupled to the further rectifier circuit 475 and configured to generate the adjustable reference signal 106 by low-pass filtering an output signal of the further rectifier circuit 475. The low-pass filter 480 may be implemented as described above for the low-pass filter 160 with respect to FIG. 1.

By adjusting the adjustable voltage signal input to the operational amplifier 460, a signal level (e.g. a voltage level) of the adjustable reference signal 106 may be adjusted.

The overload detector 400 additionally comprises a comparator circuit 430 configured to generate, based on the envelope signal 105 and the reference signal 106, a comparison signal 107 indicative of a relation between amplitudes of the envelope signal 105 and the reference signal 106. In the example of FIG. 4, the comparator circuit 430 is an operational amplifier configured to receive the envelope signal 105 at a first input node 431 and the reference signal 106 at a second input node 432. The comparison signal 107 output by the comparator circuit 430 is a binary signal indicating which of the envelope signal 105 and the reference signal 106 exhibits a higher voltage amplitude or instantaneous peak value.

Further, the overload detector 400 comprises a logic circuit 440 configured to generate a status signal 108 based on the comparison signal 107. The logic circuit 440 is configured to generate the status signal 108 such that the status signal 108 exhibits a first signal level if the comparison signal 107 indicates that the envelope signal 105 exhibits a higher voltage amplitude or instantaneous peak value than the reference signal 106, and that the status signal 108 exhibits a second signal level if the comparison signal 107 indicates that the reference signal 106 exhibits a higher voltage amplitude or instantaneous peak value than the envelope signal 105.

The overload detector 400 is capable of extracting the envelop of the differential input signal pair 101-1, 101-2 and to detect an overload condition by comparing the rectified output signal (e.g. almost a DC signal with suitable low-pass filter settings), i.e., the envelope signal 105, with a reference source, i.e. the reference signal 106. By means of the adjustable voltage signal, the further source follower transistor 470 is controlled to adjust the signal level of the reference signal 106 and, hence, the threshold level for the overload detection by the comparator circuit 430 and the logic circuit 440.

The aspect ratios (dimensions) of the source follower transistors 130-1, 130-2 and 470 may be matched. Further, the bias currents supplied by the bias current sources 180-1, 180-2 and 490 may be matched. For example, the respective bias current $I_0$ provided by each of the bias current sources 180-1 and 180-2 may be M-times the bias current $I_1$ provided by the bias current source 490. Accordingly, the adjustable reference signal 106 may track possible process-voltage-temperature variation. The total delay of the overload detector (e.g. from an input overload condition to a fault assertion indicated by the first signal level of the status signal 108) may be substantially equal to the sum of the full-wave rectification delay (which depends on the low-pass filter 160) and the delays of the comparator circuit 430 and the logic circuit 440 (e.g. sub-ns).

The overload detector 400 may support a wide frequency detection range (e.g. for input signals from few MHz up to several GHz) and a wide input power detection range (e.g. multi-range input power levels). The overload detector 400 may allow to adapt the threshold level for the overload detection in a wide range of, e.g., RF input power. Further, the overload detector 400 may enable a real-time telemetry of the input signal strength by tracking its instantaneous peak value and, inherently, the RF-envelope. Small silicon area and no power dissipation/current consumption penalty may be achieved. Further, an increased product reliability beyond stringent SOA limits, especially when scaling down channel length with most advanced technology nodes, may be achieved.

The overload detector 400 may offer a full-wave rectification of a differential RF input signal. It may further allow envelope and peak detection that may be used either for signal strength indication or for input stage protection of an RF front-end (e.g. in Complementary MOS, CMOS, technology). The overload detector 400 may further offer a programmable threshold level by (e.g. digitally) varying the reference voltage for the comparator circuit 430. Further, it may allow to track process-voltage-temperature variations by matching the source follower transistors 130-1, 130-2 and 470. It may additionally offer a flexible way to change the detection range by varying the capacitive divider ratio. The overload detector 400 is an open-loop solution and may, hence, provide a wideband and fast detection response. In addition, the overload detector 400 exhibits a high input impedance so that no extra load may be present at the (e.g. RF) input nodes 110-1 and 110-2. The overload detector 400 may enable a minimum impact in power (e.g. current consumption) and area. Further, it may offer a relatively low complexity.

Figures 2, 5:
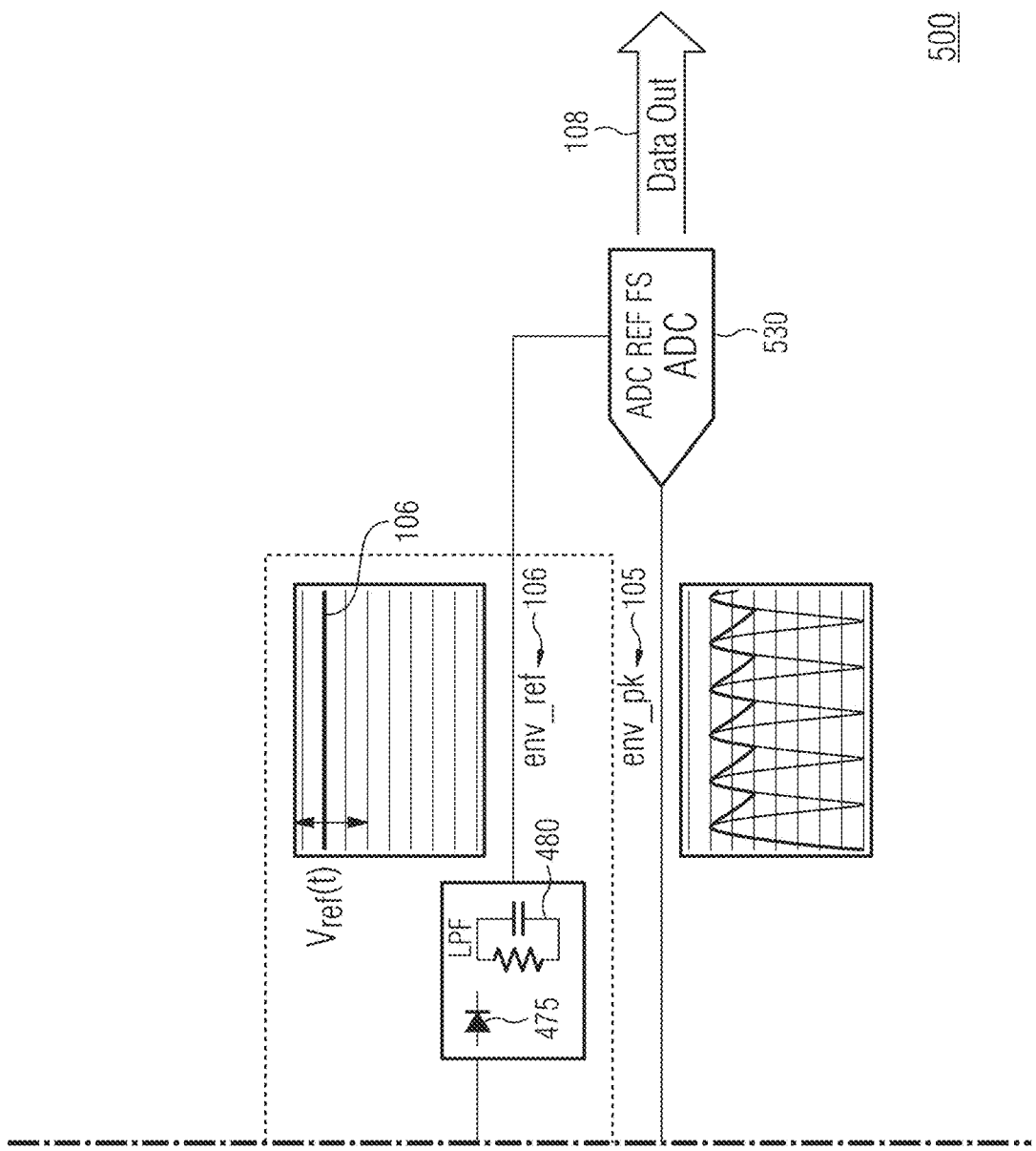
FIG. 5 illustrates a second example of an overload detector.

It is to be noted that the present technology is not limited to using an operational amplifier as the comparator circuit like in the example of FIG. 4. FIG. 5 illustrates another overload detector 500 that uses an Analog-to-Digital Converter (ADC) 530 as comparator circuit instead of the operational amplifier 430. Further, the overload detector 500 omits the logic circuit 440. Other than that, the overload detector 500 is identical to the overload detector 400 described above.

The ADC 530 configured to receive the envelope signal 105 of the signal envelope detector 410 as an input and to generate digital data based on the envelope signal 105. The comparison signal 108 output by the ADC 530 is encoded with the digital data. Further, the ADC 530 is configured to receive the reference signal 106 and adjust a full-scale value of the digital data based on the reference signal 106. In other words, the range of possible values for the digital data is adjusted based on the reference signal 106. Accordingly, the digital data indicate the relation of the envelope signal 105's voltage amplitude to the adjustable voltage amplitude of the reference signal 106. The digital data are, hence, indicative of the power of the differential input signal pair 101-1, 101-2 with respect to a threshold power indicated by the reference signal 106.

Figure 6:
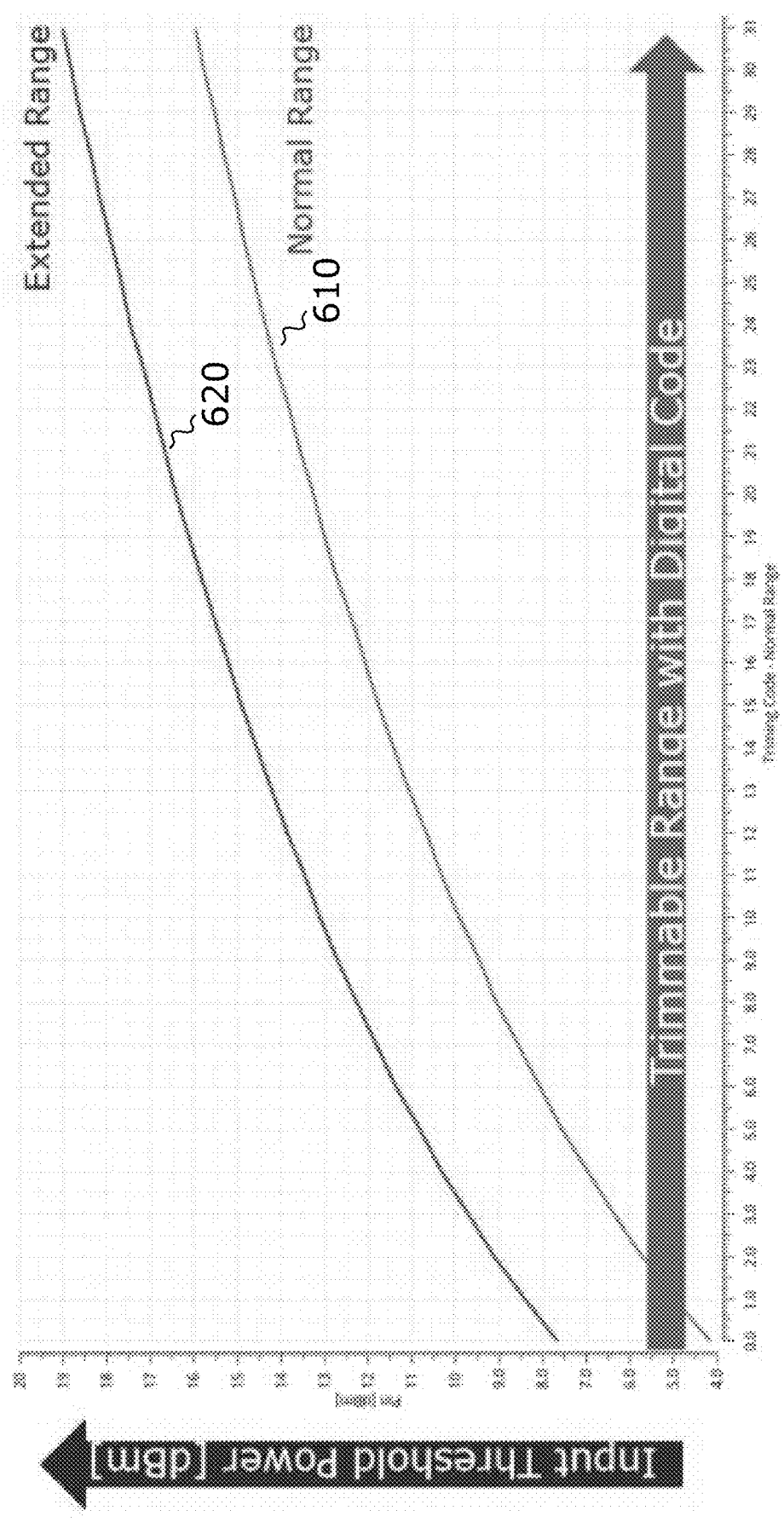
FIG. 6 illustrates exemplary input power threshold courses.

FIG. 6 illustrates two exemplary input power threshold ranges 610 and 620 for overload detection in an overload detector according to the proposed technology. For the range 610, the capacitance $C_A$ of the capacitive voltage divider's second capacitive element is adjusted to a first value. For the range 620, the capacitance $C_A$ of the capacitive voltage divider's second capacitive element is adjusted to a second value higher than the second value. Accordingly, the attenuation by the capacitive voltage divider is higher for the range 620.

The voltage source of the reference generation circuit generates the adjustable voltage signal based on a 5-bit control signal in the example of FIG. 6 such that the adjustable voltage signal and, hence, the adjustable reference signal used as threshold for the overload detection may be changed in $2^5=32$ steps. The higher the code represented by the 5-bit control signal, the higher is the adjustable voltage signal output by the voltage source and, hence, the adjustable reference signal used as threshold for the overload detection. As can be seen from FIG. 6, by increasing the adjustable voltage signal and, hence, the adjustable reference signal by means of the 5-bit control signal, the input power threshold for the overload detection may be step-wise adjusted.

In the example of FIG. 6, the input power threshold for the overload detection may be varied between +4 dBm and +19 dBm by varying the code represented by the 5-bit control signal and adjusting the capacitance $C_A$ of the capacitive voltage divider's second capacitive element. However, it is to be noted that the value ranges illustrated in FIG. 6 are merely illustrative and that the present technology is not limited thereto.

Figure 7:
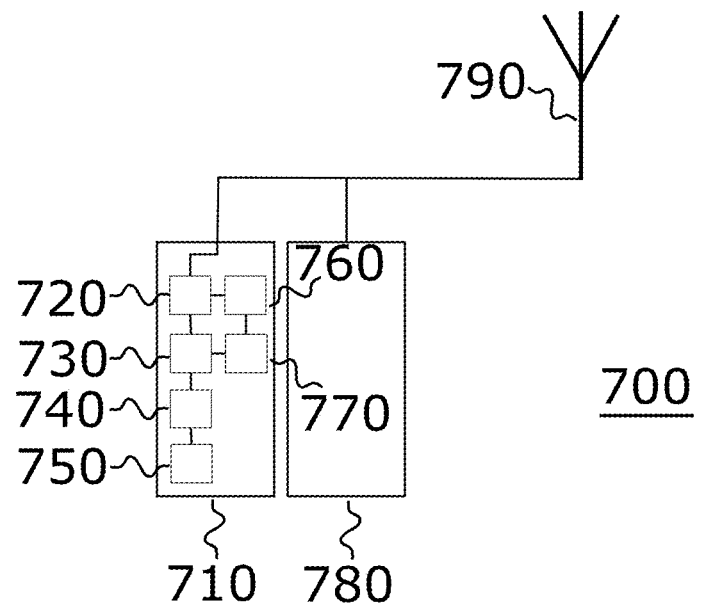
FIG. 7 illustrates an example of a base station.

An example of an implementation using overload detection according to one or more aspects of the architecture described above in connection with FIGS. 1 to 5 or one or more examples described above in connection with FIGS. 1 to 5 is illustrated in FIG. 7. FIG. 7 schematically illustrates an example of a radio base station 700 (e.g. for a femtocell, a picocell, a microcell or a macrocell) comprising an overload detector 760 as proposed.

A receiver 710 of the base station 700 comprises the overload detector 760. The receiver 710 additionally comprises analog circuitry 720 configured to receive an RF receive signal from at least one antenna element 790 of the base station 700. The analog circuitry 720 is further configured to supply an input signal to the signal envelope detector of the overload detector 760 based on the RF receive signal. In addition, the analog circuitry 720 is configured to supply the input signal to at least one attenuator 730 of the receiver 710. For example, the analog circuitry 720 may be an analog RF front-end and comprising one or more of a filter, a down-conversion mixer, Electro-Static Discharge (ESD) protection circuitry, etc.

The receiver 710 additionally comprises an ADC 750 configured to generate digital receive data based on the attenuated signal output by the at least one attenuator 730. A buffer circuit 740 is coupled between the ADC 750 and the at least one attenuator 730 for buffering the attenuated signal.

The receiver 710 further comprises a control circuit 770 for adjusting at least one of an attenuation and a gain of the at least one attenuator 730 based on the comparison signal output by the overload detector 760. For example, the attenuation and/or the gain of the at least one attenuator 730 may be adaptively adjusted based on the input signal in order to avoid overloading of the circuitry succeeding the at least one attenuator 730.

In other words, a certain "intelligence" is provided at the RF front-end of the base station 700 that is capable to monitor in real time the dynamic of the RF input signal and, based on its strength, take proper decisions. For example, the input attenuation level may be adapted in order to keep sensitive input devices of the RF-buffer circuit 740 always within SOA limits. Since device-stress is in most cases irreversible, the attenuation of the RF-input signal in case of any momentary overload condition should happen immediately, i.e. without significant delay. The overload detector 760 in combination with the control circuit 770 may allow to immediately adjust the signal attenuation by the at least one attenuator 730 in order to maximize the protection of the succeeding RF input stages.

The overload detector 760 may allow to not only adapt the threshold level over a wide range of RF input power, but also give a real-time telemetry of the input signal strength tracking its instantaneous peak value and, inherently, the RF-envelope.

The proposed overload detector 760 may be used for a "fast-attack, slow-release" RF input attenuation. This may serve two purposes:

1) RF input stage protection to ensures that the sensitive RF input stage of the receiver 710 is not destroyed due to electrical overstress in case input signals outside the boundaries for safe operation are applied to the receiver 710.
2) Overload protection for the ADC 750: in case a blocker signal appears at the RF-input, the ADC 750 may overload ("clipping") even if the operating conditions for all input stage devices remain within the safe operating area. If the threshold for the overload detector 760 is set at or slightly above the RF input level corresponding to the ADC 750's Full-Scale, a dynamic blocker clipping the ADC 750's output will immediately trigger a higher attenuation setting in the at least one attenuator 730 such that a prolonged Full-Scale clipping of the ADC 750's output may be avoided.

The control of the "intelligent" RF input attenuator 730 with overload protection (towards reliability and/or signal conditioning) may be done in the digital domain, where is it possible to also consider the ADC 750's output signal, which represents the digital receive data.

Further, the base station 700 comprises a transmitter 780 configured to generate an RF transmit signal. The transmitter 780 may use the antenna element 790 or another antenna element (not illustrated) of the base station 700 for radiating the RF transmit signal to the environment.

To this end, a base station with improved RF input monitoring and overload detection capabilities may be provided.

The base station 700 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), InterIntegrated Circuit (I²C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnay a NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 8:
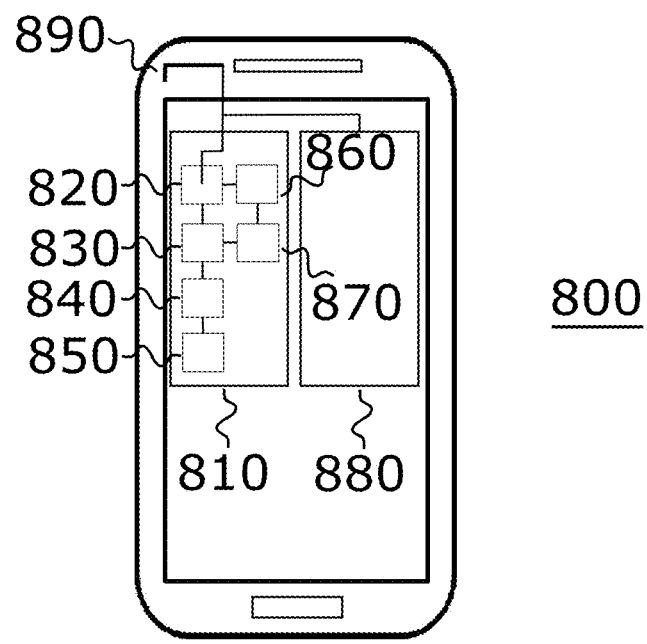
FIG. 8 illustrates an example of a mobile device.

Another example of an implementation using overload detection according to one or more aspects of the architecture described above in connection with FIGS. 1 to 5 or one or more examples described above in connection with FIGS. 1 to 5 is illustrated in FIG. 8. FIG. 8 schematically illustrates an example of a mobile device 800 (e.g. mobile phone, smartphone, tablet-computer, or laptop) comprising an overload detector 860 as proposed.

A receiver 810 of the mobile device 800 comprises the overload detector 860. The receiver 810 additionally comprises analog circuitry 820 configured to receive an RF receive signal from at least one antenna element 890 of the mobile device 800. The analog circuitry 820 is further configured to supply an input signal to the signal envelope detector of the overload detector 860 based on the RF receive signal. In addition, the analog circuitry 820 is configured to supply the input signal to at least one attenuator 830 of the receiver 810. For example, the analog circuitry 820 may be an analog RF front-end and comprising one or more of a filter, a down-conversion mixer, ESD protection circuitry, etc.

The receiver 810 additionally comprises an ADC 850 configured to generate digital receive data based on the attenuated signal output by the at least one attenuator 830. A buffer circuit 840 is coupled between the ADC 850 and the at least one attenuator 830 for buffering the attenuated signal.

The receiver 810 further comprises a control circuit 870 for adjusting at least one of an attenuation and a gain of the at least one attenuator 830 based on the comparison signal output by the overload detector 860. Similar to what is described above for the base station 700, the attenuation and/or the gain of the at least one attenuator 830 may be adaptively adjusted based on the input signal in order to avoid overloading of the circuitry succeeding the at least one attenuator 830.

Further, the mobile device 800 comprises a transmitter 880 configured to generate an RF transmit signal. The transmitter 880 may use the antenna element 890 or another antenna element (not illustrated) of the mobile device 800 for radiating the RF transmit signal to the environment.

To this end, a mobile device with improved RF input monitoring and overload detection capabilities may be provided.

The mobile device 800 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using overload detection according to the proposed architecture or one or more of the examples described above may be configured to operate according to one of the 3rd Generation Partnership Project (3GPP)-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is a signal envelope detector, comprising: an input node configured to receive an input signal; a capacitive voltage divider coupled to the input node and configured to generate an attenuated input signal by voltage division of the input signal; a source follower transistor coupled between a first node configured to receive a first voltage supply signal and a second node configured to receive a second voltage supply signal, wherein a gate terminal of the source follower transistor is coupled to the capacitive voltage divider and configured to receive the attenuated input signal; a rectifier circuit coupled to the source follower transistor and configured to receive and rectify an output signal of the source follower transistor; and a low-pass filter coupled to the rectifier circuit and configured to generate an envelope signal indicative of a rectified envelope of the input signal by low-pass filtering of an output signal of the rectifier circuit.

Example 2 is the signal envelope detector of example 1, wherein the capacitive voltage divider comprises: a first capacitive element; and a second capacitive element, wherein the second capacitive element is coupled to a third node which is configured to receive the second voltage supply signal, wherein the first capacitive element is coupled between the input node and the second capacitive element, wherein the gate terminal of the source follower transistor is coupled to a fourth node between the first capacitive element and the second capacitive element.

Example 3 is the signal envelope detector of example 2, wherein the second capacitive element is configured to adjust its capacitance based on one or more control signals.

Example 4 is the signal envelope detector of example 3, wherein the second capacitive element comprises: a first capacitor coupled between the third node and the fourth node; a plurality of second capacitors; a switch circuit configured to selectively couple, based on the one or more control signals, one or more of the plurality of second capacitor capacitors in parallel to the first capacitor.

Example 5 is the signal envelope detector of any of examples 2 to 4, wherein a capacitance of the second capacitive element is equal to or greater than a sum of a gate-source capacitance and a gate-drain capacitance of the source follower transistor.

Example 6 is the signal envelope detector of any of examples 2 to 5, further comprising a bias voltage source coupled to the fourth node and configured to supply, based on a control signal, an adjustable DC bias voltage to the fourth node.

Example 7 is the signal envelope detector of any of examples 1 to 6, further comprising a bias current source coupled between the source follower transistor and the second node, wherein the bias current source is configured to supply, based on a control signal, an adjustable bias current to a source terminal of the source follower transistor.

Example 8 is the signal envelope detector of any of examples 1 to 7, further comprising: another input node configured to receive another input signal, wherein the input signal and the other signal form a differential input signal pair; another capacitive voltage divider coupled to the other input node and configured to generate another attenuated input signal by voltage division of the other input signal; another source follower transistor coupled between a fifth node configured to receive the first voltage supply signal and a sixth node configured to receive the second voltage supply signal, wherein a gate terminal of the other source follower transistor is coupled to the other capacitive voltage divider and configured to receive the other attenuated input signal; and another rectifier circuit coupled to the other source follower transistor and configured to receive and rectify an output signal of the other source follower transistor, wherein the low-pass filter is coupled to the other rectifier circuit and configured to generate the envelope signal by low-pass filtering the output signal of the rectifier circuit and an output signal of the other rectifier.

Example 9 is the signal envelope detector of example 8, wherein the other capacitive voltage divider comprises: a third capacitive element; and a fourth capacitive element, wherein the fourth capacitive element is coupled to a seventh node configured to receive the second voltage supply signal, wherein the third capacitive element is coupled between the other input node and the fourth capacitive element, wherein the gate terminal of the other source follower transistor is coupled to an eighth node between the third capacitive element and the fourth capacitive element.

Example 10 is the signal envelope detector of example 9, wherein the fourth capacitive element is configured to adjust its capacitance based on one or more control signals.

Example 11 is the signal envelope detector of example 10, wherein the fourth capacitive element comprises: a third capacitor coupled between the seventh node and the eighth node; a plurality of fourth capacitors; another switch circuit configured to selectively couple, based on the one or more control signals, one or more of the plurality of fourth capacitor capacitors in parallel to the third capacitor.

Example 12 is the signal envelope detector of any of examples 10 to 11, wherein a capacitance of the fourth capacitive element is equal to or greater than a gate-source capacitance of the other source follower transistor.

Example 13 is the signal envelope detector of any of examples 9 to 12, further comprising a bias voltage source coupled to the eighth node and configured to supply, based on a control signal, another adjustable DC bias voltage to the eighth node.

Example 14 is the signal envelope detector of any of examples 8 to 13, further comprising another bias current source coupled between the other source follower transistor and the sixth node, wherein the other bias current source configured to supply, based on a control signal, another adjustable bias current to a source terminal of the other source follower transistor.

Example 15 is an overload detector, comprising: a signal envelope detector according to any of examples 1 to 14; and a reference generation circuit configured to generate an adjustable reference signal based on one or more control signals; and a comparator circuit configured to generate, based on the envelope signal and the reference signal, a comparison signal indicative of a relation between amplitudes of the envelope signal and the reference signal.

Example 16 is the overload detector of example 15, wherein the comparator circuit is an operational amplifier configured to receive the envelope signal at a first input node and the reference signal at a second input node, and wherein the comparison signal is a binary signal indicating which of the envelope signal and the reference signal exhibits a higher voltage amplitude or instantaneous peak value.

Example 17 is the overload detector of example 16, further comprising a logic circuit configured to generate a status signal based on the comparison signal, wherein the status signal exhibits a first signal level if the comparison signal indicates that the envelope signal exhibits a higher voltage amplitude or instantaneous peak value than the reference signal, and wherein the status signal exhibits a second signal level if the comparison signal indicates that the reference signal exhibits a higher voltage amplitude or instantaneous peak value than the envelope signal.

Example 18 is the overload detector of example 15, wherein the comparator circuit is an analog-to-digital converter configured to receive the envelope signal as an input and generate digital data based on the envelope signal, wherein the analog-to-digital converter is further configured to receive the reference signal and adjust a full-scale value of the digital data based on the reference signal, and wherein the comparison signal is encoded with the digital data.

Example 19 is the overload detector of any of examples 15 to 18, wherein the reference generation circuit comprises: a further source follower transistor coupled between a nineth node configured to receive the first voltage supply signal and a tenth node configured to receive the second voltage supply signal, a voltage source configured to output an adjustable voltage signal based on the one or more control signals; an operational amplifier configured to receive the adjustable voltage signal at a first input node and an output signal of the operational amplifier at a second input node, wherein the operational amplifier is further configured to supply its output signal to a gate terminal of the further source follower transistor, a further rectifier circuit coupled to the further source follower transistor and configured to receive and rectify an output signal of the further source follower transistor; and a low-pass filter coupled to the rectifier circuit and configured to generate the adjustable reference signal by low-pass filtering an output signal of the further rectifier circuit.

Example 20 is the overload detector of example 19, further comprising a further bias current source coupled between the further source follower transistor and the tenth node, wherein the further bias current source configured to supply a further bias current to a source terminal of the further source follower transistor.

Example 21 is a receiver comprising: an overload detector according to any of examples 15 to 20; at least one attenuator configured to generate an attenuated signal based on the input signal; and a control circuit for adjusting at least one of an attenuation and a gain of the at least one attenuator based on the comparison signal.

Example 22 is the receiver of example 21, further comprising analog circuitry configured to receive a radio frequency receive signal from an antenna element, and to supply the input signal to the signal envelope detector of the overload detector based on the radio frequency receive signal.

Example 23 is the receiver of example 21 or example 22, further comprising an analog-to-digital converter configured to generate digital receive data based on the attenuated signal.

Example 24 is the receiver of example 23, further comprising a buffer circuit coupled between the analog-to-digital converter and the at least one attenuator.

Example 25 is a base station, comprising: a receiver according to any of examples 21 to 24; and a transmitter configured to generate a radio frequency transmit signal.

Example 26 is the base station of example 25, further comprising at least one antenna element coupled to at least one of the receiver and the transmitter.

Example 27 is a mobile device, comprising: a receiver according to any of examples 21 to 24; and a transmitter configured to generate a radio frequency transmit signal.

Example 28 is the mobile device of example 27, further comprising at least one antenna element coupled to at least one of the receiver and the transmitter.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A signal envelope detector, comprising:
an input node configured to receive an input signal;

a capacitive voltage divider coupled to the input node and configured to generate an attenuated input signal by voltage division of the input signal;

a source follower transistor coupled between a first node configured to receive a first voltage supply signal and a second node configured to receive a second voltage supply signal, wherein a gate terminal of the source follower transistor is coupled to the capacitive voltage divider and configured to receive the attenuated input signal;

a rectifier circuit coupled to the source follower transistor and configured to receive and rectify an output signal of the source follower transistor; and a low-pass filter coupled to the rectifier circuit and configured to generate an envelope signal indicative of a rectified envelope of the input signal by low-pass filtering of an output signal of the rectifier circuit.

2. The signal envelope detector of claim 1, wherein the capacitive voltage divider comprises:

a first capacitive element; and a second capacitive element, wherein the second capacitive element is coupled to a third node which is configured to receive the second voltage supply signal, wherein the first capacitive element is coupled between the input node and the second capacitive element, wherein the gate terminal of the source follower transistor is coupled to a fourth node between the first capacitive element and the second capacitive element.

3. The signal envelope detector of claim 2, wherein the second capacitive element is configured to adjust its capacitance based on one or more control signals.

4. The signal envelope detector of claim 3, wherein the second capacitive element comprises:

a first capacitor coupled between the third node and the fourth node;

a plurality of second capacitors;

a switch circuit configured to selectively couple, based on the one or more control signals, one or more of the plurality of second capacitor capacitors in parallel to the first capacitor.

5. The signal envelope detector of claim 2, wherein a capacitance of the second capacitive element is equal to or greater than a sum of a gate-source capacitance and a gate-drain capacitance of the source follower transistor.

6. The signal envelope detector of claim 2, further comprising a bias voltage source coupled to the fourth node and configured to supply, based on a control signal, an adjustable DC bias voltage to the fourth node.

7. The signal envelope detector of claim 1, further comprising a bias current source coupled between the source follower transistor and the second node, wherein the bias current source is configured to supply, based on a control signal, an adjustable bias current to a source terminal of the source follower transistor.

8. The signal envelope detector of claim 1, further comprising:

another input node configured to receive another input signal, wherein the input signal and the other signal form a differential input signal pair;

another capacitive voltage divider coupled to the other input node and configured to generate another attenuated input signal by voltage division of the other input signal;

another source follower transistor coupled between a fifth node configured to receive the first voltage supply signal and a sixth node configured to receive the second voltage supply signal, wherein a gate terminal of the other source follower transistor is coupled to the other capacitive voltage divider and configured to receive the other attenuated input signal; and another rectifier circuit coupled to the other source follower transistor and configured to receive and rectify an output signal of the other source follower transistor, wherein the low-pass filter is coupled to the other rectifier circuit and configured to generate the envelope signal by low-pass filtering the output signal of the rectifier circuit and an output signal of the other rectifier.

9. The signal envelope detector of claim 8, wherein the other capacitive voltage divider comprises:

a third capacitive element; and a fourth capacitive element, wherein the fourth capacitive element is coupled to a seventh node configured to receive the second voltage supply signal, wherein the third capacitive element is coupled between the other input node and the fourth capacitive element, wherein the gate terminal of the other source follower transistor is coupled to an eighth node between the third capacitive element and the fourth capacitive element.

10. The signal envelope detector of claim 9, wherein the fourth capacitive element is configured to adjust its capacitance based on one or more control signals.

11. The signal envelope detector of claim 10, wherein the fourth capacitive element comprises:

a third capacitor coupled between the seventh node and the eighth node;

a plurality of fourth capacitors;

another switch circuit configured to selectively couple, based on the one or more control signals, one or more of the plurality of fourth capacitor capacitors in parallel to the third capacitor.

12. The signal envelope detector of claim 10, wherein a capacitance of the fourth capacitive element is equal to or greater than a gate-source capacitance of the other source follower transistor.

13. The signal envelope detector of claim 9, further comprising a bias voltage source coupled to the eighth node and configured to supply, based on a control signal, another adjustable DC bias voltage to the eighth node.

14. The signal envelope detector of claim 8, further comprising another bias current source coupled between the other source follower transistor and the sixth node, wherein the other bias current source configured to supply, based on a control signal, another adjustable bias current to a source terminal of the other source follower transistor.

15. An overload detector, comprising:

the signal envelope detector according to claim 1; and a reference generation circuit configured to generate an adjustable reference signal based on one or more control signals; and a comparator circuit configured to generate, based on the envelope signal and the reference signal, a comparison signal indicative of a relation between amplitudes of the envelope signal and the reference signal.

16. The overload detector of claim 15, wherein the comparator circuit is an operational amplifier configured to receive the envelope signal at a first input node and the reference signal at a second input node, and wherein the comparison signal is a binary signal indicating which of the envelope signal and the reference signal exhibits a higher voltage amplitude or instantaneous peak value.

17. The overload detector of claim 16, further comprising a logic circuit configured to generate a status signal based on the comparison signal, wherein the status signal exhibits a first signal level if the comparison signal indicates that the envelope signal exhibits a higher voltage amplitude or instantaneous peak value than the reference signal, and wherein the status signal exhibits a second signal level if the comparison signal indicates that the reference signal exhibits a higher voltage amplitude or instantaneous peak value than the envelope signal.

18. The overload detector of claim 15, wherein the comparator circuit is an analog-to-digital converter configured to receive the envelope signal as an input and generate digital data based on the envelope signal, wherein the analog-to-digital converter is further configured to receive the reference signal and adjust a full-scale value of the digital data based on the reference signal, and wherein the comparison signal is encoded with the digital data.

19. The overload detector of claim 15, wherein the reference generation circuit comprises:
a further source follower transistor coupled between a ninth node configured to receive the first voltage supply signal and a tenth node configured to receive the second voltage supply signal,
a voltage source configured to output an adjustable voltage signal based on the one or more control signals;
an operational amplifier configured to receive the adjustable voltage signal at a first input node and an output signal of the operational amplifier at a second input node, wherein the operational amplifier is further configured to supply its output signal to a gate terminal of the further source follower transistor,
a further rectifier circuit coupled to the further source follower transistor and configured to receive and rectify an output signal of the further source follower transistor; and
a low-pass filter coupled to the rectifier circuit and configured to generate the adjustable reference signal by low-pass filtering an output signal of the further rectifier circuit.

20. The overload detector of claim 19, further comprising a further bias current source coupled between the further source follower transistor and the tenth node, wherein the further bias current source configured to supply a further bias current to a source terminal of the further source follower transistor.

21. A receiver comprising:
the overload detector according to claim 15;
at least one attenuator configured to generate an attenuated signal based on the input signal; and
a control circuit for adjusting at least one of an attenuation and a gain of the at least one attenuator based on the comparison signal.

22. The receiver of claim 21, further comprising analog circuitry configured to receive a radio frequency receive signal from an antenna element, and to supply the input signal to the signal envelope detector of the overload detector based on the radio frequency receive signal.

23. The receiver of claim 21, further comprising an analog-to-digital converter configured to generate digital receive data based on the attenuated signal.

24. The receiver of claim 23, further comprising a buffer circuit coupled between the analog-to-digital converter and the at least one attenuator.

25. A base station, comprising:
the receiver according to claim 21; and
a transmitter configured to generate a radio frequency transmit signal.

* * * * *